United States Patent
Steiner et al.

(10) Patent No.: US 6,376,008 B1
(45) Date of Patent: Apr. 23, 2002

(54) RESIN/COPPER/METAL LAMINATE AND METHOD OF PRODUCING SAME

(75) Inventors: R. Richard Steiner, University Heights, OH (US); Shiuh-Kao Chiang, Haworth, NJ (US)

(73) Assignee: Gould Electronics Inc., Eastlake, OH (US)

( * ) Notice: Subject to any disclaimer, the term of this patent is extended or adjusted under 35 U.S.C. 154(b) by 0 days.

(21) Appl. No.: 09/400,392

(22) Filed: Sep. 21, 1999

(51) Int. Cl.[7] .................... B05D 3/02; B32B 15/08; B32B 31/04
(52) U.S. Cl. .................. 427/96; 427/207.1; 427/372.2; 427/284; 428/626; 428/901; 174/250; 156/250; 156/322; 156/307.1
(58) Field of Search ............... 428/626, 901, 428/457, 458, 460, 461, 674, 650, 652, 594, 57, 69, 141, 209, 40, 76, 416; 174/259, 250; 29/829; 427/96, 207.1, 208.4, 284, 372.2, 384; 156/60, 110.1, 182, 250, 247, 306.6, 306.9, 322, 323, 307.1, 307.3; 438/115, 108, 118, 119

(56) References Cited

U.S. PATENT DOCUMENTS

| | | | |
|---|---|---|---|
| 4,394,419 A | 7/1983 | Konicek | 428/416 |
| 4,551,576 A | 11/1985 | Rich | 174/36 |
| 4,573,752 A | 3/1986 | Rich | 339/17 F |
| 4,931,134 A | 6/1990 | Hatkevitz et al. | 156/630 |
| 5,057,372 A | 10/1991 | Imfeld et al. | 428/412 |
| 5,091,251 A | 2/1992 | Sakumoto et al. | 428/352 |
| 5,120,590 A | 6/1992 | Savage et al. | 428/76 |
| 5,153,050 A | 10/1992 | Johnston | 428/209 |
| 5,167,997 A | 12/1992 | Chamberlain et al. | 428/76 |
| 5,334,800 A | 8/1994 | Kenney | 174/35 R |
| 5,362,534 A | 11/1994 | McKenney et al. | 428/40 |
| 5,376,232 A | 12/1994 | McKenney et al. | 156/656 |
| 5,413,838 A | 5/1995 | Azuma et al. | 428/194 |
| 5,450,286 A | 9/1995 | Jacques et al. | 361/749 |
| 5,512,381 A | 4/1996 | Konicek et al. | 428/607 |
| 5,525,433 A | 6/1996 | Poutasse et al. | 428/674 |
| 5,557,843 A | 9/1996 | McKenney et al. | 29/851 |
| 5,589,280 A | 12/1996 | Gibbons et al. | 428/626 |
| 5,674,596 A | 10/1997 | Johnston | 428/209 |
| 5,822,856 A | * 10/1998 | Bhatt et al. | 29/832 |
| 5,942,315 A | * 8/1999 | Johnston | 428/209 |
| 6,132,851 A | * 10/2000 | Poutasse | 428/209 |

FOREIGN PATENT DOCUMENTS

| | | |
|---|---|---|
| EP | 0 519 631 B1 | 12/1992 |
| EP | 0 519 631 A2 | 12/1992 |
| EP | 0 519 631 A3 | 12/1994 |
| JP | 7-224252 A | 2/1994 |
| JP | 07-224252 * | 2/1994 |
| JP | 10-146915 * | 6/1998 |

* cited by examiner

Primary Examiner—Deborah Jones
Assistant Examiner—Michael LaVilla
(74) Attorney, Agent, or Firm—Mark Kusner; Michael A. Jaffe (57) ABSTRACT

A method of forming a laminate for use in the production of printed circuit boards, comprising the steps of:

a) forming a component comprised of a sheet of copper foil and a sheet of metal, the sheet of copper foil having an essentially uncontaminated surface facing an essentially uncontaminated surface of the sheet of metal, the surfaces of the sheets being in unattached contact with each other in an area that defines a substantially uncontaminated zone;

b) applying a preformed adhesive film formed of a substantially uncured polymeric material onto an exposed surface of the copper foil, the adhesive film having a first surface and a second surface, the film being attached to the component with the first surface in contact with an exposed surface of the copper foil; and c) curing the adhesive film, wherein the second surface of the adhesive film is at least partially uncured.

8 Claims, 5 Drawing Sheets

RESIN/COPPER/METAL LAMINATE AND METHOD OF PRODUCING SAME

FIELD OF THE INVENTION

The present invention relates generally to printed circuits, and more particularly, to components used in the manufacturing of printed circuits and other articles.

BACKGROUND OF THE INVENTION

In the manufacture of printed circuits, namely printed circuit boards or copper clad laminates, sheets of copper foil are typically bonded with a dielectric layer of a partially cured epoxy resin impregnated with woven glass fiber (conventionally referred to as a "pre-preg") as in the case of a circuit board, or onto another layer of foil as in the case of copper clad laminates. In both processes, the copper is etched to produce conductive paths. It is extremely important to avoid contamination of the copper foil sheets as any foreign matter, such as resin dust, fiberglass fibers, hair, grease, oil or the like, may result in dots, dents, deposits or pits on the copper foil that can adversely affect the formation of the conductive paths forming the printed circuits.

Contamination of a copper foil will typically occur at the different processing steps the foil undergoes from its initial formation to its use in forming printed circuits. The initial forming of the copper foil will of course affect the quality of the copper sheet. Thereafter, it is the processing steps, particularly the manufacturing steps in preparing and bonding the copper foil sheet to a substrate or to another foil sheet, that generate substantial contamination that may affect the foil. For example, after the copper foil is produced, at some point it is usually cut into sheets. Cutting elements may create small metal slivers or shavings, or other machinery and materials used in the manufacturing process may be a source of other types of contamination, such as dust, grease or oil droplets, that may fall onto the surface of the foil and may become imbedded therein as the foil passes over rollers and other surfaces.

To protect the copper foil during subsequent handling and shipping, it is known to secure a metallic substrate to one side of the copper foil to protect same. For example, U.S. Pat. No. 5,153,050 to Johnston discloses a copper/aluminum/copper laminate wherein the shiny side of a copper foil is bonded along its peripheral edges to a clean sheet of aluminum. U.S. Pat. No. 5,674,596 to Johnston further discloses securing copper to a metallic substrate, such as a steel or stainless steel substrate.

By sealing the edges of copper and the metallic substrate with a flexible adhesive, the interior surface of the copper sheet is not exposed to airborne contaminants of the type previously described. The metallic substrate basically functions as a protector, a carrier and a separator for adjacent sheets of copper foil. Similarly, it has been known to adhere to the shiny side of the copper foil a protective polymeric film that may be removed during the assembly of the copper sheet onto a circuit board or onto another copper sheet.

The purpose of the foregoing laminate is to provide protection to the shiny side of the foil during subsequent operations. It is during the application of a bonding resin onto the matte side of the copper foil, and the subsequent application of the foil and resin onto a circuit board or another sheet of foil, where contamination of the foil may occur. In this respect, basically, every processing step in forming printed circuits or copper clad laminates has a potential for producing airborne contaminants or surface contaminants that may adhere to the surface of the copper foil and that may interfere with the conductive lines to be etched therein. Thus, the elimination of any step between the production of the copper foil and the ultimate bonding of the material to a circuit board or another copper foil would substantially reduce the likelihood of the foil being contaminated.

The present invention overcomes limitations in the prior art and provides a copper foil having a metallic substrate adhered to one side of a copper foil and a dimensionally stable, partially cured adhesive layer secured to the other side of the copper foil, which adhesive layer may be later cured when the copper foil laminate is applied to a circuit board or to another layer of copper foil as part of a copper clad laminate.

SUMMARY OF THE INVENTION

In accordance with the present invention, there is provided a laminate for use in the production of printed circuits boards and copper clad laminates. The laminate is comprised of a copper foil layer having a first side and a second side. A metallic substrate is attached to the first side of the copper foil layer by a band of adhesive extending along the periphery of the copper foil layer. An adhesive film formed of a resinous material having a first surface and a second surface is applied to the copper foil, with the first surface of the adhesive film attached to the second side of the copper foil, wherein the second surface of the adhesive film faces away from the copper foil. The first surface of the adhesive film is substantially cured, and the second surface of the adhesive film is at least partially uncured. A releasable protective layer extends along the second surface of the adhesive film to protect same.

In accordance with another aspect of the present invention, there is provided a method of forming a laminate for use in the production of printed circuit boards and copper clad laminates, the method comprising the steps of:

forming a metallic laminate by joining a surface of a copper foil to a surface of a metallic substrate by applying a band of flexible adhesive along the periphery thereof;

applying a preformed, adhesive film onto the exposed surface of the copper foil, the adhesive being formed of a substantially uncured, polymeric material having a releasable protective strip; and curing the adhesive layer, wherein the outermost layer of the adhesive adjacent the releasable protective layer is only partially cured.

In accordance with another aspect of the present invention, there is provided a laminate for use in the production of printed circuit boards or copper clad laminates. The laminate is comprised of a metal foil layer having a first side and a second side and a metallic substrate. One side of the metallic substrate is attached to the first side of the metal foil by a band of a flexible adhesive extending along the periphery of the metal foil layer. An adhesive film formed of a polymeric material having a first surface and a second surface is provided on the metal foil with the first surface being attached to the second side of the metal foil. The first surface of the adhesive film is substantially cured, and the second surface is at least partially uncured. A releasable protective film is provided along the second surface of the adhesive substrate.

In accordance with another aspect of the present invention, there is provided a method of forming a laminate for use in the production of printed circuit boards or copper clad laminates. The method comprises the steps of forming a metallic laminate by joining a surface of a metal foil to a surface of a metallic sheet by applying a band of flexible adhesive along the periphery thereof; applying a preformed adhesive onto an exposed surface of the metal foil, the adhesive being formed of an uncured, dimensionally stable polymeric material having a releasable protective layer, the adhesive being applied to the metal foil with the polymeric material in contact with the foil; and curing the adhesive, wherein at least an outermost layer of the adhesive adjacent to the releasable protective layer is only partially cured.

In accordance with another aspect of the present invention, there is provided a laminate for use in production of printed circuit boards or copper clad laminates. The laminate is comprised of a metal foil having a first side and a second side. One side of the metallic substrate is attached to the first side of the metal foil by a material extending along the periphery of the metal foil layer. The material has adhesive properties to seal the facing interior surfaces of the metal foil and the substrate. A film formed of a resinous material is attached to the second side of the metal foil, the film having a B-stage cure and having a minimum dimensional thickness. A releasable protective film is provided along the second surface of the adhesive substrate.

In accordance with another aspect of the present invention, there is provided a method of forming a laminate for use in the production of printed circuit boards or copper clad laminates, comprising the steps of: forming a metallic laminate by joining a surface of a metal foil to a surface of a metallic sheet by applying a material having adhesive properties along the periphery thereof; applying a preformed, adhesive film onto an exposed surface of the metal foil, the adhesive film being formed of a substantially uncured, polymeric material on a releasable protective film, the adhesive film being applied to the metal foil with the polymeric material in contact with the foil; cutting the laminate into sheets; and heating the laminate in a furnace at a predetermined temperature for a predetermined period of time to cure the adhesive film to a B-stage cure.

In accordance with another aspect of the present invention, there is provided a laminate for use in production of printed circuit boards or copper clad laminates. The laminate is comprised of a metal foil layer having a first side and a second side. One side of the metallic substrate is attached to the first side of the metal foil by a band of a flexible, adhesive-like material extending along the periphery of the metal foil layer. A first resin layer of uniform thickness is provided on the metal foil, the first resin layer cured to a C-stage. A second resin layer of uniform thickness is provided on the first resin layer, the second layer cured to a B-stage.

In accordance with another aspect of the present invention, there is provided a method of forming a laminate for use in the production of printed circuit boards or copper clad laminates, comprising the steps of forming a metallic laminate by joining a surface of a metal foil to a surface of a metallic sheet by applying a band of flexible, adhesive-like material along the periphery thereof to join the metal foil to the metallic sheet; applying a preformed, dimensionally stable first resin film onto an exposed surface of the metal foil, the first resin film being formed of an uncured, first resin material; applying a preformed second resin film onto the first resin film; and heating the metallic laminate and the first and second resin layers to cause the first level to be cured to a C-stage and the second layer to be cured to a B-stage.

In accordance with another aspect of the present invention, there is provided a laminate for use in production of printed circuit boards or copper clad laminates, comprising a metal foil layer having a first side and a second side; a metallic substrate, one side of the metallic substrate being attached to the first side of the metal foil along the periphery of the metal foil layer; and an adhesive film formed of a substantially uncured, polymeric material having a first surface and a second surface, the first surface being attached to the second side of the metal foil.

In accordance with another aspect of the present invention, there is provided a method of forming a laminate for use in the production of printed circuit boards or copper clad laminates, comprising the steps of forming a metallic laminate by joining a surface of a metal foil to a surface of a metallic sheet along the periphery thereof; applying a preformed, adhesive film onto an exposed surface of the metal foil, the adhesive strip being formed of a substantially uncured, polymeric material on a releasable protective strip, the adhesive film being applied to the metal foil with the polymeric material in contact with the foil; and curing the adhesive film wherein at least an outermost layer of the adhesive strip adjacent to the releasable protective layer is only partially cured.

In accordance with another aspect of the present invention, there is provided a laminate for use in production of printed circuit boards or copper clad laminates, comprising a metal foil having a first side and a second side; a metallic substrate, one side of the metallic substrate being attached to the first side of the metal foil along the periphery of the metal foil layer to seal the facing interior surfaces of the metal foil and the substrate; a film formed of a resinous material attached to the second side of the metal foil, the film having a B-stage cure and having a minimum dimensional thickness; and a releasable protective film along the second surface of the adhesive substrate.

In accordance with a further aspect of the present invention, there is provided a method of forming a laminate for use in the production of printed circuit boards or copper clad laminates, comprising the steps of forming a metallic laminate by joining a surface of a metal foil to a surface of a metallic sheet along the edges thereof; applying a preformed, dimensionally stable adhesive film onto an exposed surface of the metal foil, the adhesive film being formed of a substantially uncured, polymeric material, the adhesive film being applied to the metal foil with the polymeric material in contact with the foil; cutting the laminate into sheets; and heating the laminate in a furnace at a predetermined temperature for a predetermined period of time to cure the adhesive film to a B-stage cure.

In accordance with another aspect of the present invention, there is provided a laminate for use in production of printed circuit boards or copper clad laminates. The laminate is comprised of a metal foil having a first side and a second side. One side of a metallic substrate is attached to the first side of the metal foil to seal the facing interior surfaces of the metal foil and the substrate. A layer formed of a resinous material is attached to the second side of the metal foil. The layer has a first surface and a second surface, the first surface of the layer being attached to the second side of the metal foil and being substantially cured, and the second surface of the layer being at least partially uncured.

It is an object of the present invention to provide a metal foil laminate for use in the manufacturing of printed circuit boards and copper clad laminates.

Another object of the present invention is to provide a metal foil laminate as described above that has a metallic protective layer to protect one side of the metal foil from contamination.

Another object of the present invention is to provide a metal foil laminate as described above that has a dimensionally stable, partially uncured resin layer on one side of the metal foil.

A still further object of the present invention is to provide a metal foil laminate as described above, wherein a portion of the resin layer in contact with the metal foil is fully cured, and a portion of the resin layer facing away from the metal foil is only partially cured.

A still further object of the present invention is to provide a metal foil laminate as described above having a removable protective layer on the partially cured portion of the resin layer.

A still further object of the present invention is to provide a metal foil laminate as described above, wherein the resin layer in contact with the metal foil is fully cured.

A still further object of the present invention is to provide a metal foil laminate as described above, wherein the metal foil is copper and the metallic protective layer is aluminum.

A still further object of the present invention is to provide a process for curing a resin layer on a metal foil, wherein the innermost portion of the resin layer in contact with the metal foil is fully cured, and the outermost portion of the resin layer facing away from the metal foil is only partially cured.

These and other objects and advantages will become apparent from the following description of preferred embodiments of the invention taken together with the accompanying drawings.

BRIEF DESCRIPTION OF THE DRAWINGS

The invention may take physical form in certain parts and arrangement of parts, embodiments of which are described in detail in the specification and illustrated in the accompanying drawings, wherein.

DETAILED DESCRIPTION OF THE PREFERRED EMBODIMENTS

Figure 1:
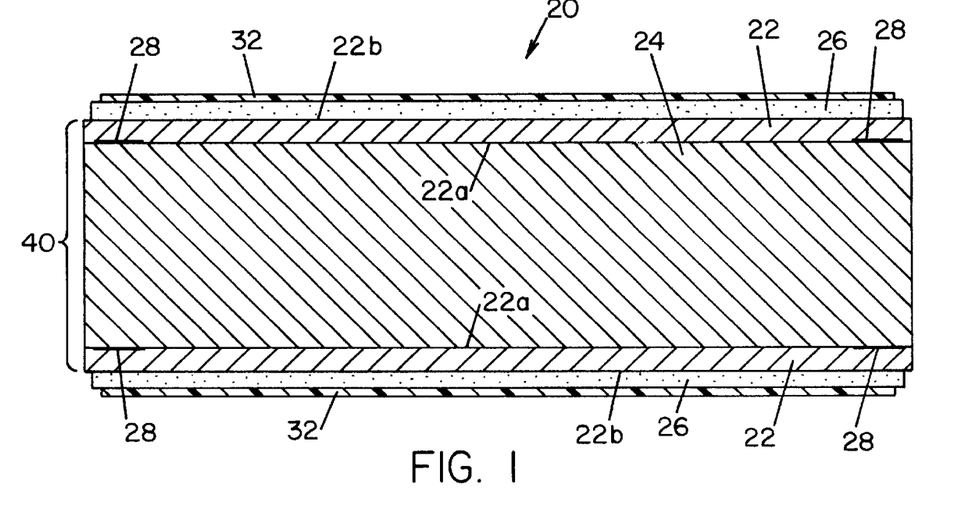
FIG. 1 is a cross-sectional view of a resin-coated copper laminate illustrating a preferred embodiment of the present invention.

Referring now to the drawings wherein the showings are for the purpose of illustrating preferred embodiments of the invention, and not for the purpose of limiting same, FIG. 1 shows a metal/metal/resin laminate 20 in accordance with one aspect of the present invention. Laminate 20 is for use in the manufacturing of printed circuit boards and copper clad laminates. Laminate 20 includes at least one metal foil sheet 22 mounted onto a metallic substrate 24, and a layer of a partially uncured resin 26 that is provided on the outer surface of metal foil sheet 22. When ultimately fabricated into a printed circuit or a copper clad laminate, metal foil sheet 22 is the material that forms the conductive paths, and resin layer 26 is the material used to secure metal foil sheet 22 onto a dielectric layer (as in the case of a printed circuit board) or onto another layer of metal foil (as in the case of a copper clad laminate). Metallic substrate 24 is provided as a support element and as a protective layer to protect metal foil sheet 22 from contamination, and is ultimately discarded during the manufacturing of a printed circuit board or a copper clad laminate.

The use of a metallic substrate to protect a surface of a metal foil from contamination is disclosed in U.S. Pat. No. 5,153,050 to Johnston and U.S. Pat. No. 5,674,596 to Johnston, the disclosures of which are expressly incorporated herein by reference. As indicated in those patents, a laminate comprised of a metal sheet on a metallic substrate may be formed by applying a bead of a flexible adhesive 28 around the peripheral edge, i.e., the borders of the metallic substrate. The present invention utilizes a laminate formed of a metal foil on a metallic substrate as generally disclosed in U.S. Pat. Nos. 5,153,050 and 5,674,596, and adds a layer of an uncured, dimensionally stable resin 26 onto the exposed surface of the metal foil sheet.

In the embodiment to be hereinafter described, metal foil sheet 22 is formed of copper and metallic substrate 24 is formed of aluminum, and copper foil sheets 22 are provided on each side of aluminum substrate 24 to form a copper/aluminum/copper laminated component 40. It will be appreciated by those skilled in the art that metal foil sheet 22 may be formed of metal materials other than copper, such as, by way of example and not limitation, gold, nickel, silver, indium coated copper foil, nickel coated copper foil or the like. Further, it will also be appreciated that metallic substrate 24 may be formed of metallic materials other than aluminum, such as, by way of example and not limitation, steel, stainless steel, brass, nickel alloy or the like.

Copper/aluminum/copper laminated component 40 is comprised of an inner aluminum substrate 24 having copper sheets 22 applied on each of the surfaces thereof. (It will further be appreciated that metal sheet 22 may be applied to only one side of metallic substrate 24.) Each of copper foil sheets 22 has a first side 22a facing substrate 24 and a second side 22b facing away from aluminum substrate 24. First side 22a of copper sheet 22 may be what is typically referred to in the art as the "shiny side" of copper foil sheet 22. This side being the shiny side formed on a smooth, polished metal drum during an electrodeposition process. Second side 22b may be what is conventionally referred to the "matte side" of the copper foil, the matte side being the side of the foil away from the drum in an electrodeposition process. As used herein, terms such as "shiny side" and "matte side" are used for the purpose of illustration, and not for the purpose of limiting the present invention. First side 22a (typically the shiny side) of copper foil sheet 22 is disposed to face an uncontaminated surface of the aluminum substrate 24. In a preferred embodiment, copper foil sheets 22 are secured to aluminum substrate 24 by a continuous bead of flexible, adhesive-like material 28 that extends around the peripheral edges, i.e., the borders, of the aluminum substrate. Resin-like material 28 may be an actual adhesive, or may be a plastic material having adhesive properties. It will also be appreciated that copper foil sheets 22 may be secured to substrate 24 along its periphery by means other than by adhesive without deviating from the present invention. Other means of securing the periphery of foil sheets 22 to substrate 24 may be used so long as the facing, interior surface of foil sheets 22 is protected from contamination. It will also be appreciated that certain other types of copper foils such as reverse treated or double treated foils will have a "matte side" of the foil disposed to face the uncontaminated aluminum.

According to the present invention, a uniform layer 26 of a resin material is applied to second surface 22*b* of copper sheet 22. Resin layer 26 is preferably at least partially uncured. More preferably, the uncured portion of resin layer 26 is located at the outermost portion thereof at surface 22*b*, and the innermost portion of resin layer 26, i.e., the portion of resin layer 26 at surface 22*a* in contact with the copper layer, is partially cured. Even more preferably, the innermost surface of resin layer 26 is completely cured to bond resin layer 26 to copper sheet 22. A removable protective layer 32 formed of a polymer film is provided over resin layer 26. Resin layer 26 preferably has a thickness of about 0.5 mils to about 10.0 mils, and more preferably, about 1.0 mils to about 3.0 mils.

Figure 2:
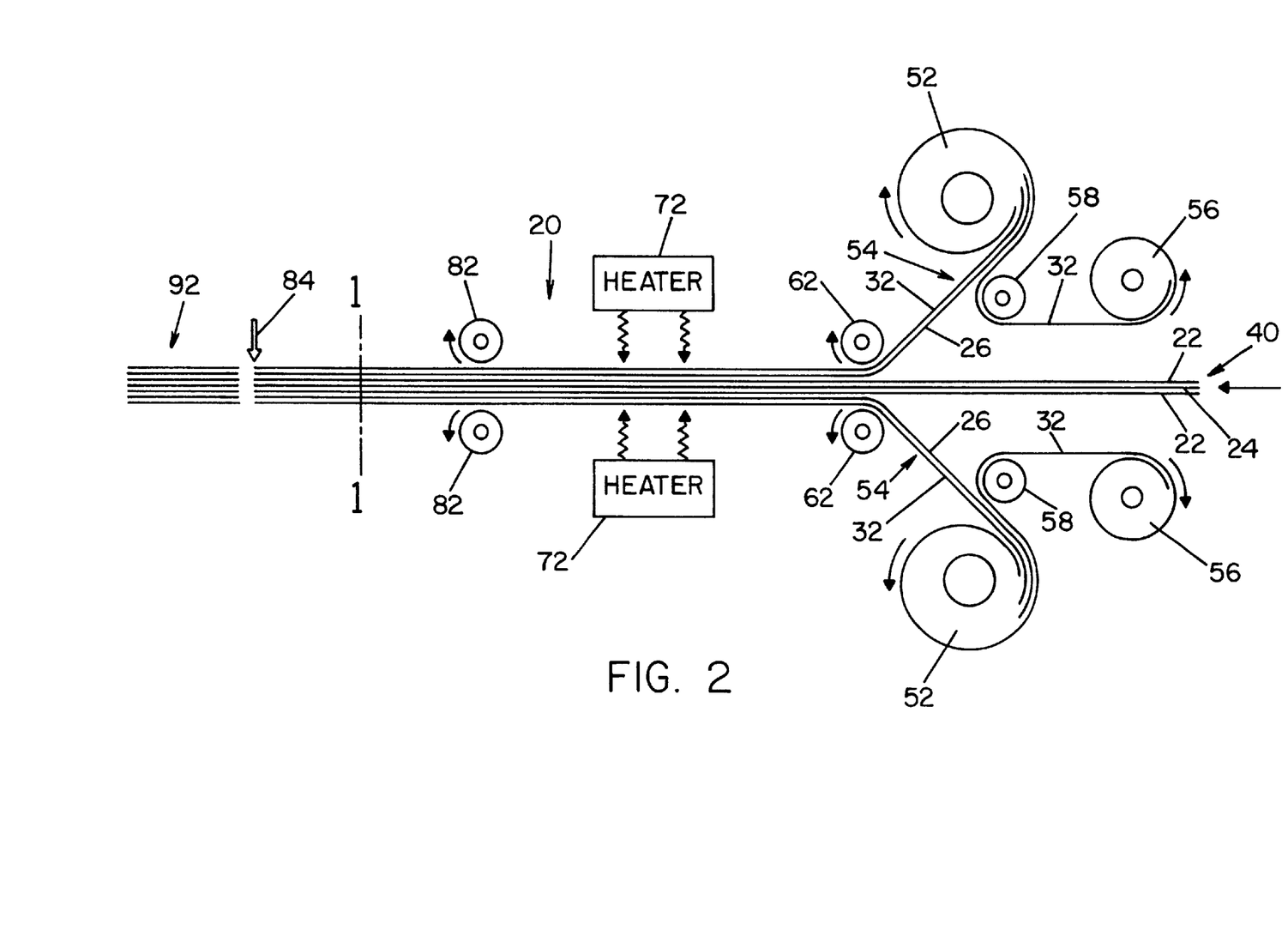
FIG. 2 is an elevational, schematic view of a process line for forming a resin-coated copper laminate, as illustrated in FIG. 1.

Referring now to FIG. 2, a process for forming laminate 20 is schematically illustrated. In FIG. 2, a copper/aluminum/copper laminated component 40 is conveyed along a predetermined path. Copper/aluminum/copper laminated component 40 is preferably formed in accordance with aforementioned U.S. Pat. No. 5,153,050. In the embodiment shown, copper/aluminum/copper laminated component 40 is fed between two like feed rollers 62 on which a generally continuous ribbon 54 of a resin is wound. According to the present invention, ribbon 54 is an uncured or substantially uncured resin material that is generally dimensionally stable under the exertion of stacking forces along its surface. As used herein, the term "dimensionally stable," as applied to the uncured resin material, shall mean the resin has properties wherein it will not significantly alter its shape or flow under the pressure exerted along its planar surface as a result of stacking pressure. Basically, it is intended that the term "dimensionally stable" as applied to the resin film shall distinguish such film from layers of uncured resin that flow when under the exertion of planar pressure.

A product manufactured and sold by Minnesota Mining & Manufacturing (3M) under the name "High Performance Epoxy Adhesive Bonding Film" finds advantageous use as resin layer 26 in the production of laminate 20. This product is comprised of an epoxy resin and is available in thicknesses of 1 or 2 mils under 3M designations "9901" and "9902" respectively. The material is provided by the manufacturer with removable protective polymer films 32 on both surfaces thereof. The material has the following physical properties as disclosed by the manufacturer:

| Property | Units | | IPC Test |
|---|---|---|---|
| Glass Transition* | ° C. | 180 | |
| CTE 20°–110° C. | ppm/° C. | 60 | |
| 110°–180° C. | | 87 | |
| 180°–250° C. | | 213 | |
| Peel Strength | Lbs./inch | 8 | 2.4.9 |
| Volatile Content | % | 1 | 2.3.37 |
| Moisture Absorption | % | 1.7 | 2.6.2B |
| Chemical Resistance | % | >90 | 2.3.2 |
| Dielectric Constant* | | 3.4 | 2.5.5.3 |
| Dissipation Factor* | | .022 | 2.5.5.3 |
| Dielectric Strength | Volts/mil | 2200 | D-149 |
| Insulation Resistance | Megohms | 1.00E + 06 | 2.6.3.2 |
| Volume Resistivity | Megohms-cm | 5.00E + 07 | 2.5.17 |
| Surface Resistivity | Megohms | 7.00E + 05 | 2.5.17 |
| Solder Float | | Pass | 2.4.13 |
| Low Temperature Flexibility | | Pass | 2.6.18 |

-continued

| Property | Units | | IPC Test |
|---|---|---|---|
| Flexural Endurance | Cycles | 1787 | 3.7.4 |
| Fracture Toughness | Mpa*m 1/2 | 0.65 | |
| Modulus | GPa | 3.5 | |

*Tests performed on neat resin.

In the process shown, protective polymer films 32 on the surface of resin ribbons 54 facing copper/aluminum/copper laminated component 40 are removed by a film take-up rollers 56. The inner layer of each polymer film is directed over idler rollers 58 onto take-up rollers 56. The removal of the inner layer of protective polymer films 32 exposes the resin materials to the surfaces of copper foil sheets 22. Heated nip rollers 62 force resin layers 26 and polymer films 32 onto the exposed surfaces of copper 22 of copper/aluminum/copper laminated component 40, wherein resin layers 26 engages the matte sides of copper 22. Preferably, nip rollers 62 are heated sufficiently to warm resin layers 26 to ensure positive contact with the exposed surfaces of copper sheets 22.

In accordance with one aspect of the present invention, copper/aluminum/copper laminated component 40 with resin layers 26 and polymer films 32 thereof are preferably conveyed in a continuous fashion past heating elements, designated 72 in the drawings. Heating elements 72 are operable to heat uncured resin layers 26. The heating of resin layers 26 may be undertaken by conventional gas-fired or electric-fired heating means, but is more preferably performed by an induction heater, wherein the induction heating of the metallic layers, i.e., aluminum substrate 24 and copper sheets 22, heat resin layers 26 through radiation and conduction as the heat radiates and is conducted to resin layers 26 from copper/aluminum/copper laminated component 40. Heating element 72 is controlled such that resin layers 26 on copper/aluminum/copper laminated component 40 are not fully cured. In this respect, the heating of resin layers 26 is preferably controlled such that resin layers 26 are cured to what is conventionally referred to in the art as "B-staged." In this respect, it is conventionally understood that an "A-staged" resin refers to a resin that is substantially uncured. A "B-staged" resin refers to a resin that is partially cured, although not fully cured. A "C-staged" resin refers to a resin that is substantially fully cured. Thus, in accordance with the present invention, in the embodiment shown in FIG. 2, resin layers 26 on copper/aluminum/copper laminated component 40 are only partially cured to a B-stage. Laminate 20 then preferably passes between two nip rollers 82. Continuous laminate 20 formed in accordance with the aforementioned described process may then be cut into sheets 92, as schematically illustrated in FIG. 2, by a shearing blade 84. Depending upon the resin material forming resin layers 26, continuous curing of resin layers 26 may not be feasible in a continuous process of the type heretofore described. An alternate method of curing resin layers 26 would be to cut laminate 20 into sheets following the application of resin layer 26 onto copper foil sheet 22, and to cure stacks of such sheets in a furnace at a predetermined time and temperature to cured resin layers 26 to a B-staged resin.

The process shown in FIG. 2 thus provides a copper/aluminum/copper laminated component 40 having B-staged resin layers 26 of uniform thickness thereon, each resin layer 26 having a removable protective polymer film 32 covering resin layer 26. The present invention thus provides a laminate 20 suitable for manufacturing printed circuit boards and/or copper clad laminates. Laminate 20 has been described with a removable protective film 32. It will be appreciated to those skilled in the art that while such film 32 is preferable, laminate 20 may be formed without protective film 32 on resin layer 26. Laminate 20 is used by removing protective polymer films 32 and attaching B-staged resin layers 26 directly to pre-preg dielectric boards, or onto the surfaces of copper sheets on copper clad laminates. By providing a circuit manufacturer with a B-staged resin layer 26 on copper sheet 22 the possibility of contamination of copper sheet 22 during the processing required for shipping is reduced. With laminate 20, a circuit manufacturer need only remove protective polymeric films 32 on resin layers 26 and attach laminate 20 onto pre-preg dielectric or onto the surfaces of circuits on copper clad laminates, and then heat B-staged resin layers 26 until they are fully cured and are attached to the circuit boards or to the surfaces of circuits on copper clad laminates. Thereafter, protective aluminum substrate 24 may be removed to expose shiny sides 22a of copper sheets 22. Copper sheets 22 may then be etched to produce desired circuit patterns for a printed circuit board, or another laminate 20 may be applied thereto to produce multi-layers for a copper clad laminate. Laminate 20 thus facilitates simpler steps in the manufacturing of printed circuit boards and copper clad laminates, and eliminates possible contamination of copper sheets 22 during shipment and subsequent processing.

Figure 3:
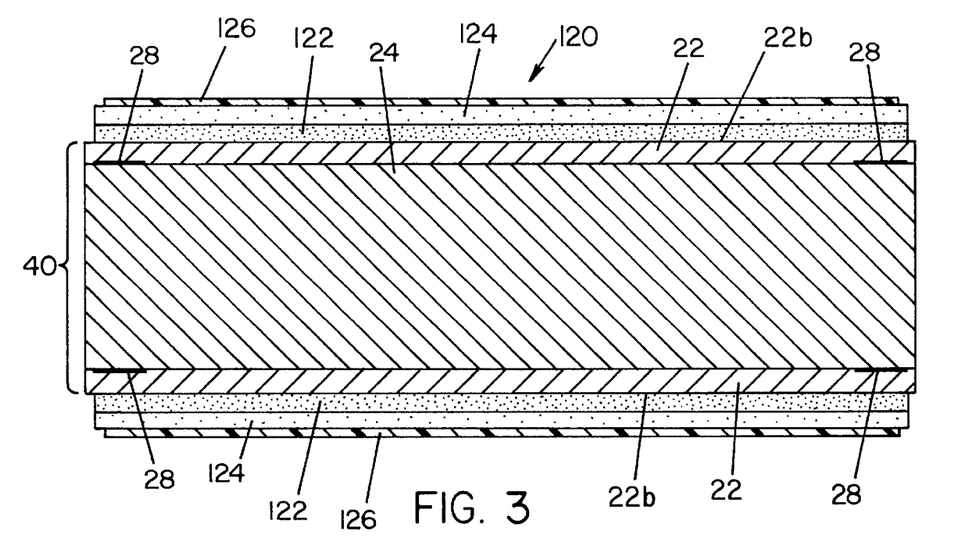
FIG. 3 is a cross-sectional view of a resin-coated copper laminate illustrating an alternate embodiment of the present invention.

Referring now to FIG. 3, a laminate 120 illustrating an alternate embodiment of the present invention is shown. Laminate 120 includes the same copper/aluminum/copper laminated component 40 as shown in FIG. 1, and laminated component 40 is formed in the same manner as heretofore described. Accordingly, elements of laminated component 40 as shown in FIG. 3 have been assigned the same reference numbers as like elements in FIG. 1. In accordance with this alternate embodiment, a first resin layer 122 comprised of a first resin material is provided on the unexposed matte side surfaces 22b of copper sheets 22. A second resin layer 124, comprised of a second resin material, is applied to the outer surface of the first resin layer 122. A removable polymer protective film 126 is provided on the exposed outer surface of second resin layer 124. In accordance with this aspect of the present invention, the first resin material forming resin layer 122 preferably has a curing rate different from that of the resin material forming second layer 124. More preferably, the first resin material has a quicker curing rate than the resin material forming second layer 124, wherein first resin layer 122 could be heated and cured to a C-stage, while second resin layer 124, when exposed to the same heat, would cure to a B-stage. Stated another way, laminate 120 is comprised of a copper/aluminum/copper laminated component 40 having first resin layers 122 on matte sides 22b of copper sheets 22 that are fully cured and second resin layers 124, on first resin layer 122, wherein second resin layers 124 are at least partially uncured, i.e., A-staged, B-staged or some mixture thereof. Removable polymer films 126 are provided as protective barriers for the surfaces of second resin layers 124.

Figure 4:
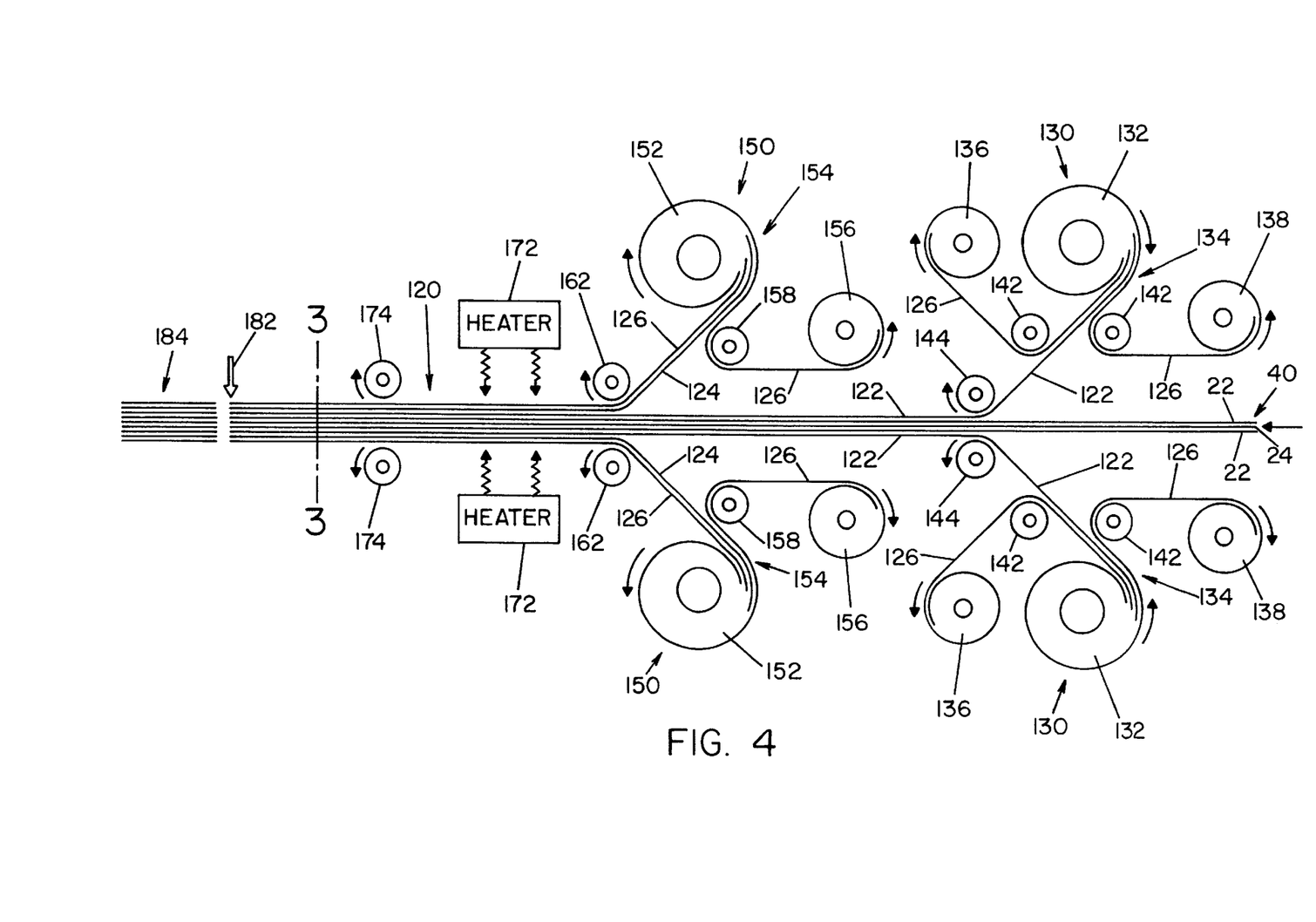
FIG. 4 is an elevational, schematic view of a process line for forming a resin-coated copper laminate, as illustrated in FIG. 3.

Referring now to FIG. 4, a process line for forming laminate 120 is shown. As indicated above, the inner portion of laminate 120 is comprised of a copper/aluminum/copper laminated component 40 as heretofore described. Copper/aluminum/copper 40 is conveyed along a path past a first group 130 of rollers, wherein a feed roller 132 provides a ribbon 134 of a first resin material that forms resin layers 122. Resin layers 122 are provided between two polymer films 126. A pair of take-up rollers 136, 138 is provided to remove protective polymer films 126 on resin ribbons 134. Specifically, polymer films 126 on both sides of resin ribbons 134 are fed over idler rollers 142 onto take-up rollers 136, 138. First resin layers 122 are applied to copper/aluminum/copper laminated component 40, and heated nip rollers 144 force first resin layers 122 into surface engagement with copper sheets 22 of copper/aluminum/copper laminated component 40. Copper/aluminum/copper laminated component 40 with first resin layers 122 thereon passes between a second group of rollers 150 that include resin ribbon feed rollers 152 on which ribbons 154 of the second resin material are provided. Ribbons 154 have protective polymer films 126 on both sides thereof. Feed rollers 152 provide ribbons 154 of second resin material to form second resin layers 124 on laminate 120. Take-up rollers 156 are provided to peel away polymer films 126 along the surface of resin ribbons 154 that are to be brought into contact with first resin layers 122. Specifically, polymer films 126 on the inner surface of resin ribbons 154 pass over idler rollers 158 and are wound onto take-up rollers 156. Heated nip rollers 162 bring ribbons 154 of second resin material into surface contact with the exposed surface of first resin layers 122. As indicated above, outer protective polymer films 126 of second resin layers 124 preferably remain on the upper exposed surface of second resin layers 124.

Composite laminate 120 is then preferably conveyed between heating elements 172 of the type heretofore described. Heating elements 172 are preferably controlled such that sufficient heat is provided to laminate 120 to fully cure first resin layers 122 to a C-stage, but not so high as to cause second resin layers 124 to be fully cured. In this respect, second resin layers 124 are preferably heated to a B-stage. Following the heating, the respective layers and sheets of material pass between nip rollers 174. As above, the generally continuous strip of laminate 120 may be sheared by a cutting element 182 into sheets 184, as schematically illustrated in FIG. 4. As noted above with respect to the previous embodiment, the resin materials used in resin layers 122, 124 may not be suitable for curing in a continuous process. If so, sheets may be cut from laminate 120 following the application of resin layers 122, 124 to copper sheets 22, and such sheets may be stacked and cured in a conventional furnace at predetermined times and temperatures to fully cure first resin layers 122 to a C-stage, but cure second resin layers 124 to only a B-stage.

FIGS. 3 and 4 thus illustrate a laminate 120 and a method of forming same, wherein the combined resin layers 122, 124 on copper sheets 22 have a first portion in contact with a copper sheets 22 that is fully cured, and an outer exposed portion that is at least partially uncured. The uncured outer portion of the resin combined layers have removable polymer films 126 whereby, upon removal of the polyfilm, the partially uncured, exposed portion of laminate 120 may be applied to dielectric boards as part of a printed circuit board or onto an exposed copper sheet as part of a surface laminate circuit. The application of additional heat will fully cure the outer portion of the combined resin layer, i.e., will fully cure second resin layer 124, thereby securing copper sheet 22 and resin layers 122, 124 onto either dielectric substrates or a copper clad laminate assembly.

Figure 5:
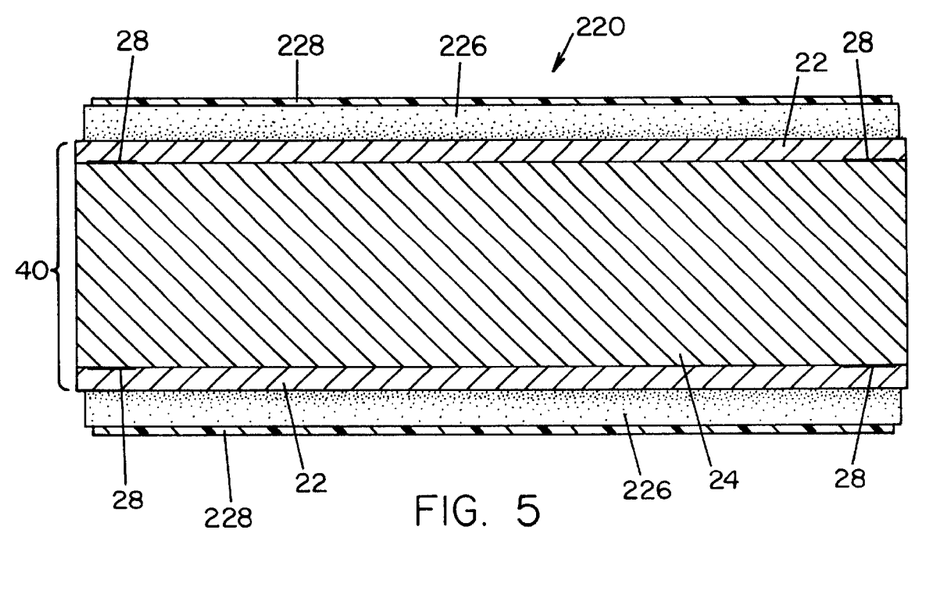
FIG. 5 is a cross-sectional view of a resin-coated copper laminate illustrating a still further embodiment of the present invention.

Referring now to FIG. 5, a laminate 220 illustrating yet another embodiment of the present invention is shown. As with the foregoing embodiments, laminate 220 is comprised partially of copper/aluminum/copper laminated component 40 formed as discussed above. On copper sheets 22 of copper/aluminum/copper laminated component 40, resin layers 226 are applied. In FIG. 5, resin layers 226 are shown to be thicker than the resin layers in FIGS. 1 and 3, solely for the purposes of illustration. The showing of layers 226 is not intended to indicate a relative thickness. Protective polymer films 228 are provided on the outermost surfaces of resin layers 226.

In accordance with this embodiment of the present invention, the innermost surface, i.e., the surfaces of resin layers 226 in contact with copper sheets 22, are fully cured to a C-stage. The outermost surfaces of resin layers 226 are at least partially uncured. Stated another way, the outermost surfaces of resin layers 226 are uncured A-stage, or a partially cured B-stage pre-preg or a mixture of both. More specifically, in the embodiment shown, a curing gradient exists from the innermost surface of resin layers 226, where the resin is fully cured, to the outermost portion of resin layers 226, where the resin is at least partially uncured. In FIG. 5, the curing gradient is graphically illustrated by the shading of resin layers 226 wherein the darker shading is intended to illustrate a more cured region of resin layers 226 and a lighter region is intended to illustrate a less cured or uncured region of resin layers 226. Laminate 220 thus provides a structure wherein copper sheets 22 are fully bonded to a cured portion of resin layers 226, whereas the outer portions of resin layers 226 are at least partially uncured, thereby facilitating subsequent attachment of resin layers 226 to either dielectric substrates or onto a copper pattern of copper clad laminates.

Figure 6:
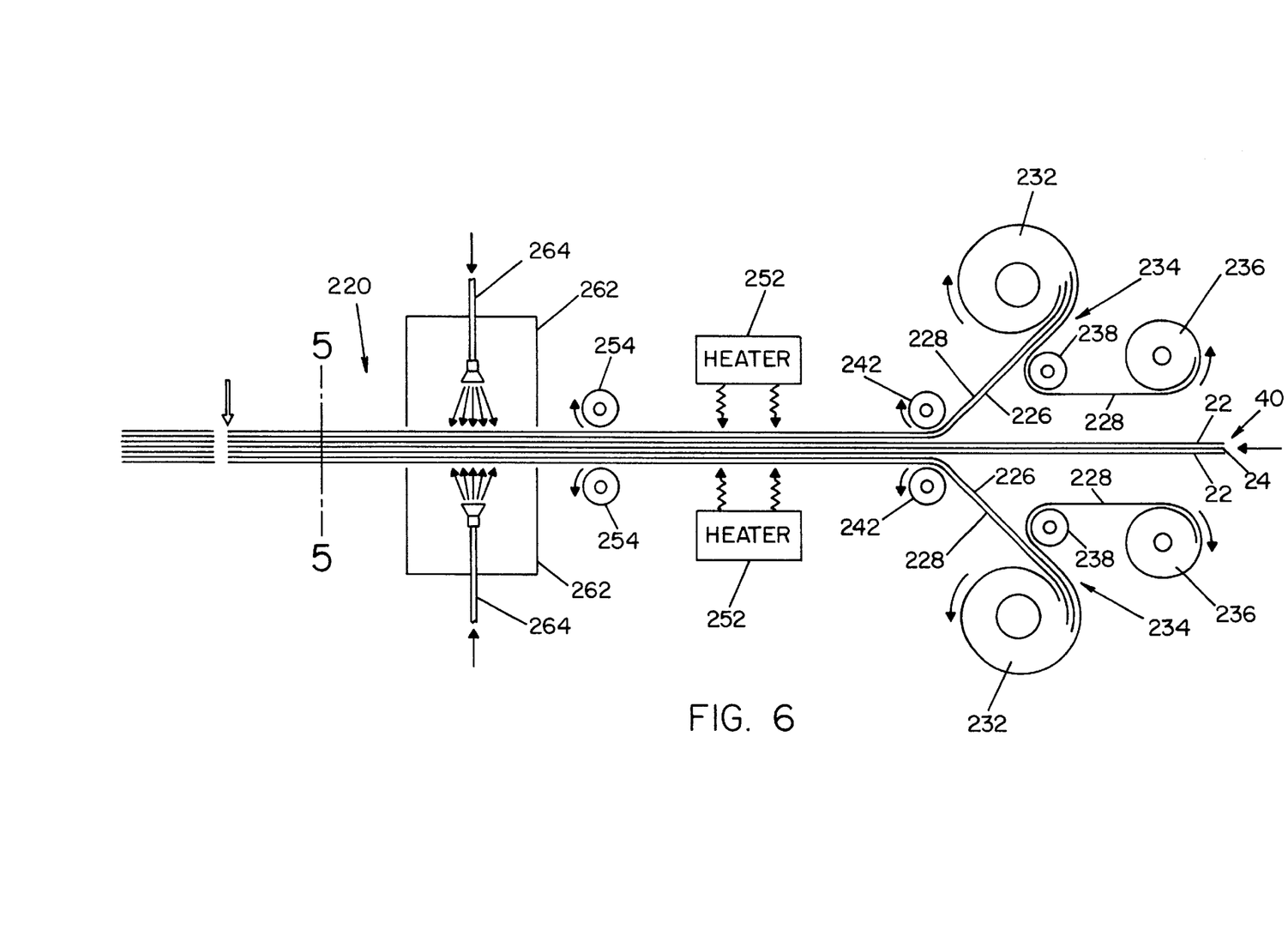
FIG. 6 is an elevational, schematic view of a process line for forming a resin-coated copper laminate, as illustrated in FIG. 5.

Referring now to FIG. 6, a process for forming laminate 220 is illustrated. As in the preceding embodiments, a copper/aluminum/copper laminated component 40 is conveyed along a predetermined path. Feed rollers 232 having ribbons 234 of resin thereon are disposed on opposite sides of laminated component 40. Ribbons 234 are comprised of a dimensionally stable, substantially uncured resin that forms resin layers 226. As also indicated above, the resin typically has protective polymer film layers 228 on the opposite surfaces thereof. In the embodiment shown, take-up rollers 236 remove protective polymer films 228 from the innermost surface of resin ribbons 234 so as to expose the surfaces of the resin material to the surfaces of copper sheets 22. Specifically, polymer films 228 are removed from resin ribbons 234 and pass over idler rollers 238 and are wound onto take-ups 236. Contact rollers 242 force the exposed surfaces of the resin ribbons 234 onto the surfaces of copper sheets 22 to form resin layers 226. Protective polyfilms 228 on the upper surfaces of resin layers 226 remain in place. Copper/aluminum/copper laminated component 40 with the resin layers 226 and polymer film layers 228 thereon passes by heating elements 252 that are provided to heat resin layers 226. In accordance with this embodiment, heating elements 252 are induction heating devices to heat resin layers 226 by induction heating. Importantly, because the alternating magnetic field will not affect the resin layer, the heating of resin layers 226 will be the result of heat radiated and conducted into resin layers 226 as the metallic layers of copper/aluminum/copper laminated component 40 heat up. In other words, the heat from the inner metal layers, i.e., copper sheets 22 and aluminum substrate 24 migrate outward into adhesive layers 226 to heat same. According to the present invention, the induction heating of copper/aluminum/copper laminated component 40 is preferably done such that the temperature of the region of resin layers 226 in contact with copper sheets 22 reach a temperature whereby these regions of resin layers 226 are filly cured to a C-stage, but the outer regions of resin layers 226, and specifically, at outer surfaces of resin layers 226, do not attain a temperature for a sufficient length of time to fully cure such region, and therefore, the outer surfaces of resin layers 226 remain at least partially uncured, i.e., at an A-stage, a B-stage or a mixture of both.

To ensure that the outer surface regions of resin layers 226 do not reach a temperature wherein they will fully cure, the outer surfaces of laminate structure 220 are preferably cooled. In the embodiment shown, composite laminate structure 220 passes through a chamber 262 wherein the outer surfaces of laminate 220, specifically polymer films 228 and the outer regions of resin layers 226, are cooled by exposure to a cooling gas, such as the vapor of liquid nitrogen, wherein the gas maintains the outermost surface regions of adhesive layers 226 at a temperature below their full curing temperature. In the embodiment shown in FIG. 6, spray fixtures 264 are schematically illustrated for spraying liquid nitrogen into chamber 262 to cool the surfaces of laminate 220. As will be appreciated, other methods of chilling the outer surface of resin layers 226 may be employed. For example, chilling rollers (i.e., rollers having cold water flowing therethrough; not shown) may be used and contact the outer surface of layers 226 to keep the same cool. In this respect, the method of cooling, in and of itself, is not critical to the present invention. It is only important that the outer surface region of resin layers 226 remain cool and does not reach a temperature wherein the resin will fully cure.

As will be appreciated by those skilled in the art, the heating of the inner core of laminated component 40 of laminate 220 through induction heating may be controlled in conjunction with the cooling of the outer region of resin layers 226 to ensure that the innermost portion of resin layers 226 in contact with copper sheets 22 of copper/aluminum/copper laminated component 40 are substantially cured, thereby bonding resin layers 226 to copper sheets 22, while the outermost regions of adhesive layers 226 are at least partially uncured. In this respect, the outermost regions of adhesive layers 226 may be completely uncured, i.e., an A-staged resin, or may be semi-cured, i.e., a B-staged resin or may be a mixture of both. Following the cooling of the composite laminate, the strip of laminate 220 may be cut or sheared into sheets as schematically illustrated in FIG. 6.

FIGS. 5 and 6 thus illustrate a laminate 220, and a method of forming same, wherein laminate 220 has resin layers 226 bonded to copper sheets 22 by fully cured resin regions, and outermost regions that are at least partially uncured, thereby enabling their attachment to dielectric substrates or onto other layers of copper clad laminates in a subsequent manufacturing process. As indicated above, additional heating of resin layers 226 will fully cure the resin, thereby securing resin layers 226 (and ultimately copper sheets 22) onto the substrates or onto copper clad laminates.

The present invention thus provides a laminate structure for use in manufacturing printed circuit boards and copper clad laminates, wherein the assembly step of making the circuit board or the copper clad laminate can be undertaken with a clean, uncontaminated copper foil sheet protected by the aluminum substrate. The copper foil sheet already has an adhering resin thereon, thereby eliminating additional processing steps and the possibility of contamination of the copper foil during such resin coating steps or other coating steps.

In the embodiments shown, the thicknesses of the respective materials have, in some instances, been exaggerated for the purposes of illustration. It should be noted that in keeping with the trend in electronic circuitry, thinner and thinner materials are and will be preferably used. By way of example and not limitation, as disclosed in the foregoing embodiments, aluminum substrate 24 may have a thickness ranging from about 0.006 inches (6 mils) to 0.015 inches (15 mils) and copper sheets 22 may have a thickness ranging from about ¼ ounce (about 9 microns) to 2 ounces (about 70 microns). With respect to resin layers 26, 122, 124 and 226 disclosed in the foregoing embodiments, such layers may vary in thickness depending upon particular applications. Moreover, it should also be appreciated that although FIGS. 1 and 5 show laminates having a single resin layer, multiple layers of multiple types of resin material may find advantageous application in forming resin/copper/aluminum laminates for use in the electronic industry.

As indicated above, a material available under the name "High Performance Epoxy Adhesive Bonding Film 9901/9902" manufactured by Minnesota Mining Manufacturing (3M) finds advantageous application to the present invention, and provides a dimensionally stable, uncured resin suitable for application in forming the laminate structures disclosed heretofore. Although the material heretofore described is comprised of an epoxy, it will of course be appreciated that the composition of the resin material forming the resin layer may vary, and that numerous materials may find advantageous application in laminate structures used in the electronic industry.

Further, techniques for heating the resin layers to effect curing thereof may include electric resistance heating, gas or electric convection heating, radiant heating, such as infrared or ultraviolet heating, or the like. With respect to the process disclosed in FIG. 6, methods of heating wherein copper/aluminum/copper laminated component 40 is first heated, and then through radiation and conduction, heat is radiated and conducted into resin layers 226 are preferred. As indicated in the aforementioned description, induction heating would produce a desired heating of the metal core laminate, as would electrical resistance heating.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A method of forming a laminate for use in the production of printed circuit boards, comprising the steps of:
    a) forming a component comprised of a sheet of copper foil that is to be assembled onto a printed circuit board or copper clad laminate during the manufacture of a printed circuit board or copper clad laminate and a sheet of metal that is to be discarded during the manufacture of a printed circuit board or copper clad laminate, said sheet of copper foil having an essentially uncontaminated surface facing an essentially uncontaminated surface of said sheet of metal, said surfaces of said sheets being in unattached contact with each other in an area that defines a substantially uncontaminated zone;
    b) applying a preformed adhesive film formed of a substantially uncured polymeric material onto an exposed surface of said copper foil, said adhesive film having a first surface and a second surface, said film being attached to said component with said first surface in contact with an exposed surface of said copper foil; and
    c) curing said adhesive film, wherein said second surface of said adhesive film is at least partially uncured.

2. A method of forming a laminate as defined in claim 1, wherein said sheet of metal is aluminum.

3. A method of forming a laminate as defined in claim 2, wherein said sheet of copper foil is maintained against said aluminum sheet by a bead of adhesive disposed between said sheets along the edges thereof.

4. A method of forming a laminate as defined in claim 1, wherein said polymeric material is cured by heating said sheet of copper foil.

5. A method of forming a laminate as defined in claim 4, wherein said sheet of copper foil is are heated to produce a gradient cure in said polymeric material, wherein said first surface of said adhesive film is substantially cured and said second surface of said adhesive film is at least partially uncured.

6. A method of forming a laminate as defined in claim 1, wherein prior to step b), an intermediate adhesive film is applied to said copper foil and cured to a generally fully cured state, and said preformed adhesive is then applied onto said intermediate adhesive film.

7. A method of forming a laminate as defined in claim 1, further comprising the step of:
    d) applying a releasable protective film onto said adhesive film.

8. A method of forming a component for use in the production of printed circuit boards or copper clad laminates, comprising the steps of: p1 a) forming a component comprised of a sheet of copper foil that is to be assembled onto a printed circuit board or copper clad laminate during the manufacture of a printed circuit board or copper clad laminate and a sheet of metal that is to be discarded during the manufacture of a printed circuit board or copper clad laminate, said sheet of copper foil having an essentially uncontaminated surface facing an essentially uncontaminated surface of said sheet of metal, said surfaces of said sheets being in unattached contact with each other in an area that defines a substantially uncontaminated zone;
    b) applying a preformed, first resin film onto an exposed surface of said copper foil, said first resin film being formed of an uncured, first resin material;
    c) applying a preformed, said second resin film being formed of an uncured, second resin material onto said first resin film; and
    d) heating said component and said first and second resin films to cause said first film to be cured to a C-stage and said second film to be cured to a B-stage.

* * * * *

UNITED STATES PATENT AND TRADEMARK OFFICE
CERTIFICATE OF CORRECTION

PATENT NO.    : 6,376,008 B1
DATED         : April 23, 2002
INVENTOR(S)   : R. Richard Steiner et al.

It is certified that error appears in the above-identified patent and that said Letters Patent is hereby corrected as shown below:

Column 1,
Line 3, insert the following sentence: -- This application is a division of copending Application No. 09/132,638, filed on August 11, 1998. --

Signed and Sealed this

Second Day of March, 2004

JON W. DUDAS
*Acting Director of the United States Patent and Trademark Office*